United States Patent
Clark et al.

(10) Patent No.: US 6,944,784 B2
(45) Date of Patent: Sep. 13, 2005

(54) FLIP-FLOP HAVING MULTIPLE CLOCK SOURCES AND METHOD THEREFORE

(75) Inventors: Lawrence T. Clark, Phoenix, AZ (US); Eric J. Hoffman, Chandler, AZ (US); Susan M. Graham, Chandler, AZ (US); Dale J. Brown, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 539 days.

(21) Appl. No.: 09/895,343

(22) Filed: Jun. 29, 2001

(65) Prior Publication Data

US 2003/0005347 A1 Jan. 2, 2003

(51) Int. Cl.[7] .................................................. G06F 1/04
(52) U.S. Cl. ........................ 713/600; 365/154; 327/203
(58) Field of Search ................................. 713/500, 502, 713/600; 714/726, 731, 738; 365/154, 189.02, 189.05, 201; 327/202, 203, 206; 324/765, 769, 549

(56) References Cited

U.S. PATENT DOCUMENTS

| | | | | |
|---|---|---|---|---|
| 4,602,210 A | * | 7/1986 | Fasang et al. | 714/731 |
| 4,669,061 A | * | 5/1987 | Bhavsar | 365/154 |
| 4,862,068 A | * | 8/1989 | Kawashima et al. | 324/73.1 |
| 5,155,382 A | * | 10/1992 | Madden et al. | 327/203 |
| 5,235,699 A | * | 8/1993 | Shaffer et al. | 713/502 |
| 5,459,735 A | * | 10/1995 | Narimatsu | 714/731 |
| 5,706,232 A | * | 1/1998 | McClure et al. | 365/201 |
| 6,356,487 B1 | * | 3/2002 | Merritt | 365/189.05 |
| 6,704,897 B1 | * | 3/2004 | Takagi | 714/739 |

* cited by examiner

Primary Examiner—Lynne H. Browne
Assistant Examiner—Than Du
(74) Attorney, Agent, or Firm—Kenneth M. Seddon

(57) ABSTRACT

Briefly, in accordance with one embodiment of the invention, a flip-flop operates as a master-slave flip flop in a test mode and operates as a pulsed latch in normal operation. Two clock signals having non-overlapping transitions are used to provide and control the flow of input data.

10 Claims, 6 Drawing Sheets

FLIP-FLOP HAVING MULTIPLE CLOCK SOURCES AND METHOD THEREFORE

BACKGROUND

As integrated circuits such as, for example, microprocessors and microcontrollers, become more advanced, it becomes increasingly more important and more difficult to test the integrated circuits. This difficulty is due, at least in part, to the increasing complexity of the integrated circuit between its sources of input and the output provided by the integrated circuit. In other words, the internal workings of an integrated circuit become more complex. This, in turn, may make it more difficult to control the inputs or predict the output of the integrated circuit by altering the input sequence to the integrated circuit.

One technique that may be used to test the operability of an integrated circuit is to place the integrated circuit into a scan mode. In such a test mode, the clock of the integrated circuit is slowly cycled while a known input stream is fed to the integrated circuit. While the input test data is provided to the integrated circuit, the output of the integrated circuit is monitored to verify if the integrated circuit is operating within acceptable parameters.

However, one problem with using scan mode is that the all portions or subcircuits may not be operating in the same time domain or processing data at the same speed. Consequently, race-through conditions may exist where data is provided to some parts of the integrated circuit either earlier or later than expected. One possible solution to address this is to add circuitry (e.g. delay transistors) that may be used to reduce the risk of race-through. However, the addition of such circuitry may add to both the power consumption and manufacturing cost of the integrated circuit. Thus, there is a continuing need for better ways to test integrated circuits while addressing at least some of the problems associated with race-through.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
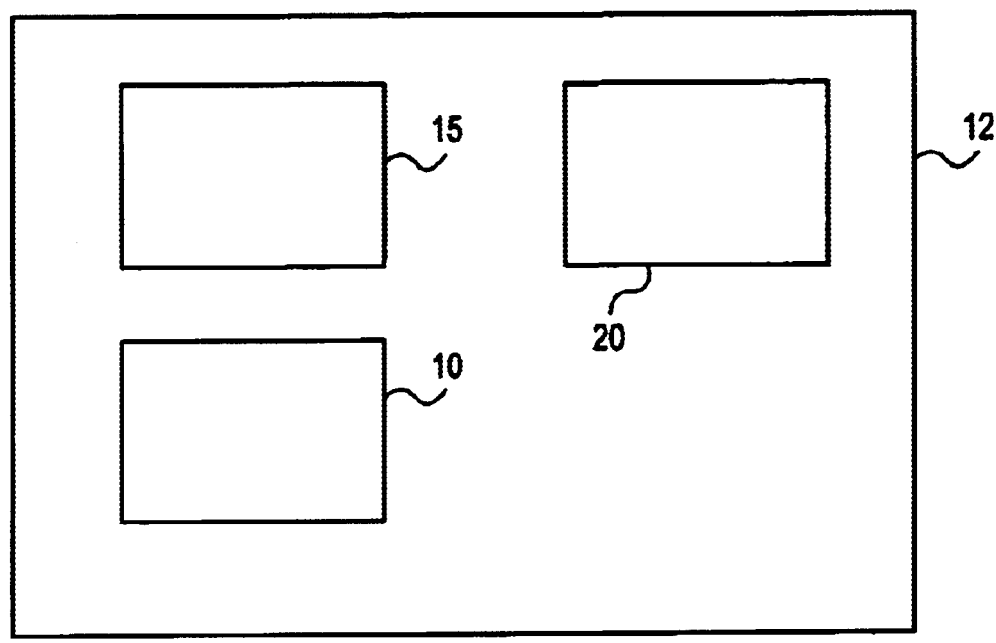
FIG. 1 is a schematic representation of a portable communication device in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computing device selectively activated or reconfigured by a program stored in the device. Such a program may be stored on a storage medium, such as, but is not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Note, in this description a "#" symbol may be used to indicate the logical complement of a signal. For example, if BL is a logic "1," then BL# may be a logic "0," although this invention is not limited to any particular signaling scheme.

Turning to FIG. 1, an embodiment 100 in accordance with the present invention is described. Embodiment 100 may comprise a portable device 12 such as a mobile communication device (e.g., cell phone), a two-way radio communication system, a one-way pager, a two-way pager, a personal communication system (PCS), a portable computer, or the like. Although it should be understood that the scope and application of the present invention is in no way limited to these examples.

Embodiment 100 here includes an integrated circuit 10 that may comprise, for example, a microprocessor, a digital signal processor, a microcontroller, or the like. However, it should be understood that only a portion of integrated circuit 10 is included in FIG. 1 and that the scope of the present invention is not limited to these examples. Embodiment 100 may also optionally include other components such as a display 15 and memory 20 (e.g. RAM or non-volatile memory). Memory 20 may be used to store instructions to be executed by integrated circuit 10 and display 15 may present the results of the execution of those instructions to a user.

Figure 2:
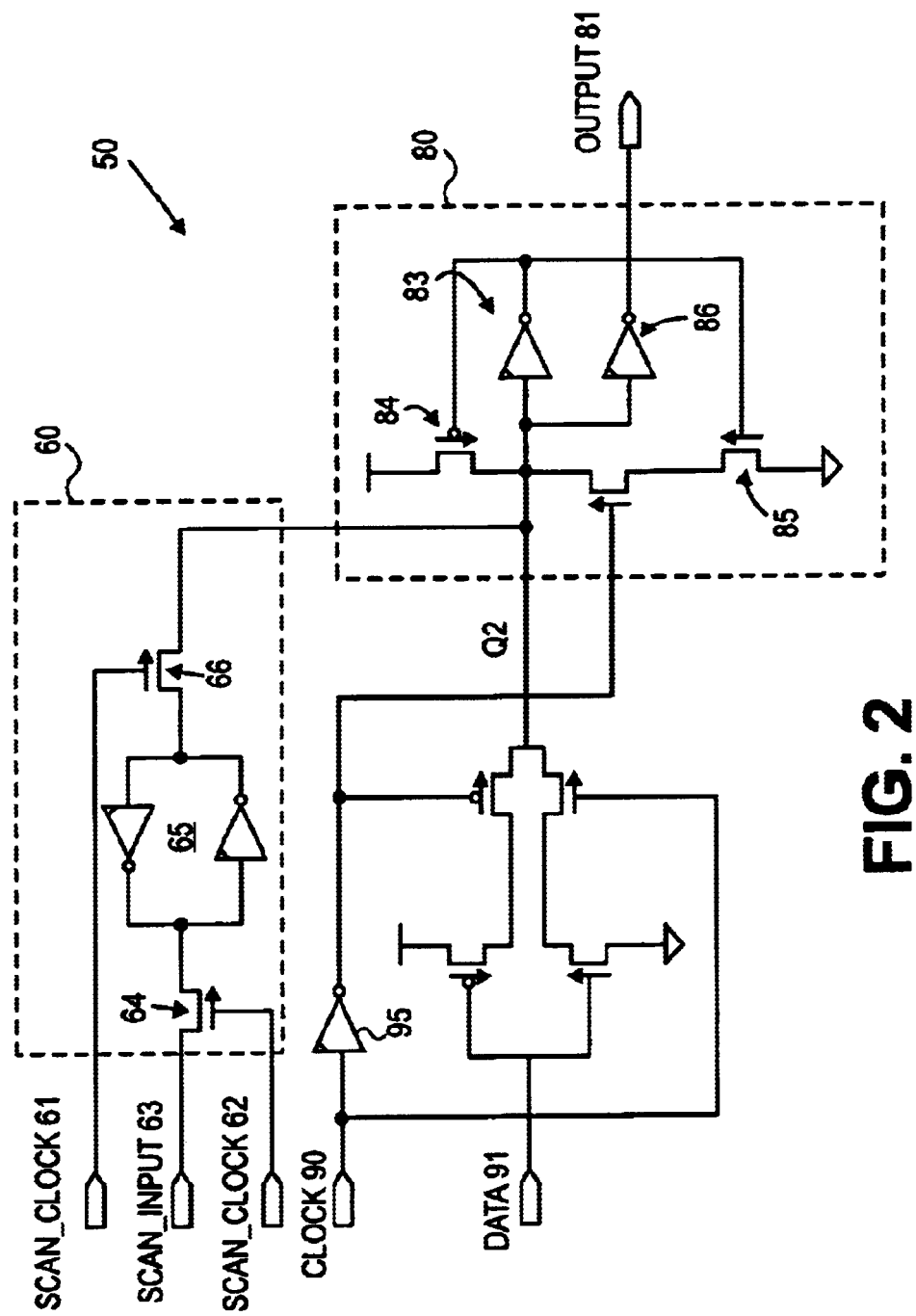
FIG. 2 is a schematic representation of a flip-flop is accordance with an embodiment of the present invention.

Referring now to FIG. 2, an embodiment of a flip-flop 50 in accordance with the present invention is provided. In this embodiment, Integrated circuit 10 may comprise one or more flip-flops such as flip-flop 50 shown in FIG. 2. As will be explained in more detail below, flip-flop 50 may operate differently depending on the operation mode of integrated circuit 10. For example, if integrated circuit is in a test mode, or some other mode where part of the functionality of integrated circuit 10 or embodiment 100 is being verified, flip-flop 50 may operate as a master-slave flip-flop. Additionally, flip-flop 50 may operate as a pulsed latch when integrated circuit when integrated circuit 10 is not being tested (e.g. a normal operation mode).

Flip-flop 50 may include a master circuit 60 and a slave circuit 80 that may be used to provide input to other circuits within integrated circuit 10 (not shown) while integrated circuit is in a test mode. The use of master circuit 60 and slave circuit 80 may reduce the risk of a race through condition while the operation of integrated circuit 10 is being verified.

Master circuit 60 may receive two or more clock signals (i.e. SCAN_CLOCK 61 and SCAN_CLOCK# 62) that may be used to provide a test input value (i.e. SCAN_INPUT 63) to master circuit 60 and then slave circuit 80. Although the scope of the present invention is not necessarily limited in this respect, SCAN_CLOCK 61 and SCAN_CLOCK 62 may be clock signals with a predetermined periodicity and be generated such that they do not have overlapping transitions. In other words, the clock signals may be generated such that only one of them transition from high to low state, or vice-versa, while the other clock signal is remains at the same logical level. This may allow each signal to control or trigger a particular result within flip-flop 50 or integrated circuit 10 so that the flow of data may be synchronized. This may be desirable in some particular embodiments to reduce the risk of a race-through condition as will become apparent below.

While integrated circuit 10 is in a test mode, a transistor 64 may be used to control when SCAN_INPUT is stored on a storage element 65. Storage element 65 may be provided by using a variety of techniques such as two or more inverters arranged in a feedback loop as shown, although the scope of the present invention is not limited in this respect. In alternative embodiments, other circuits, such as registers, latches, RAM, etc., may be used. Thus, when SCAN_CLOCK# is a high logic level, SCAN_INPUT 63 may be stored in storage circuit 65. Note, in this particular embodiment, although the scope of the present invention is not limited in this respect, transistor 66 is disabled since SCAN_CLOCK 61 is the logic low state. This, in turn, may reduce the risk of the SCAN_INPUT 63 data from racing through to slave circuit 80.

After the test data (i.e., SCAN_INPUT 63) has been stored in storage unit 65, the data may be provided to slave circuit 80 on a subsequent transition of SCAN_CLOCK 61. When SCAN_CLOCK 61 transitions to a high logic level, transistor 66 may be enabled to allow provide slave circuit 80 with the data stored in storage unit 65. Thus, clock signals SCAN_CLOCK 61 and SCAN_CLOCK 62 may be used to control the flow of test input data to slave circuit 80. Slave circuit 80 may, in turn, store the test input data and provide that data as an output signal (i.e. OUTPUT 81) to other portions of integrated circuit 10 (not shown).

Slave circuit 80 may comprise a storage unit that may be used to store the input value provided to flip-flop 50. Although the scope of the present invention is not limited in this respect, an inverter 83 and transistors 84–85 may be used to retain or store the logic value provided by master circuit 60. Slave circuit 80 may also comprise an inverter 86 that may be used to drive and provide OUTPUT 81 to the other portions of integrated circuit 10.

In this particular embodiment, transistors 64 and 66 are n-channel transistors that may be enabled when a high logic level is applied to their respective gate terminals. However, it should be understood that in alternative embodiments transistors 64 and/or 66 may be p-channel transistors that are enabled by the opposite logic level.

Figure 3:
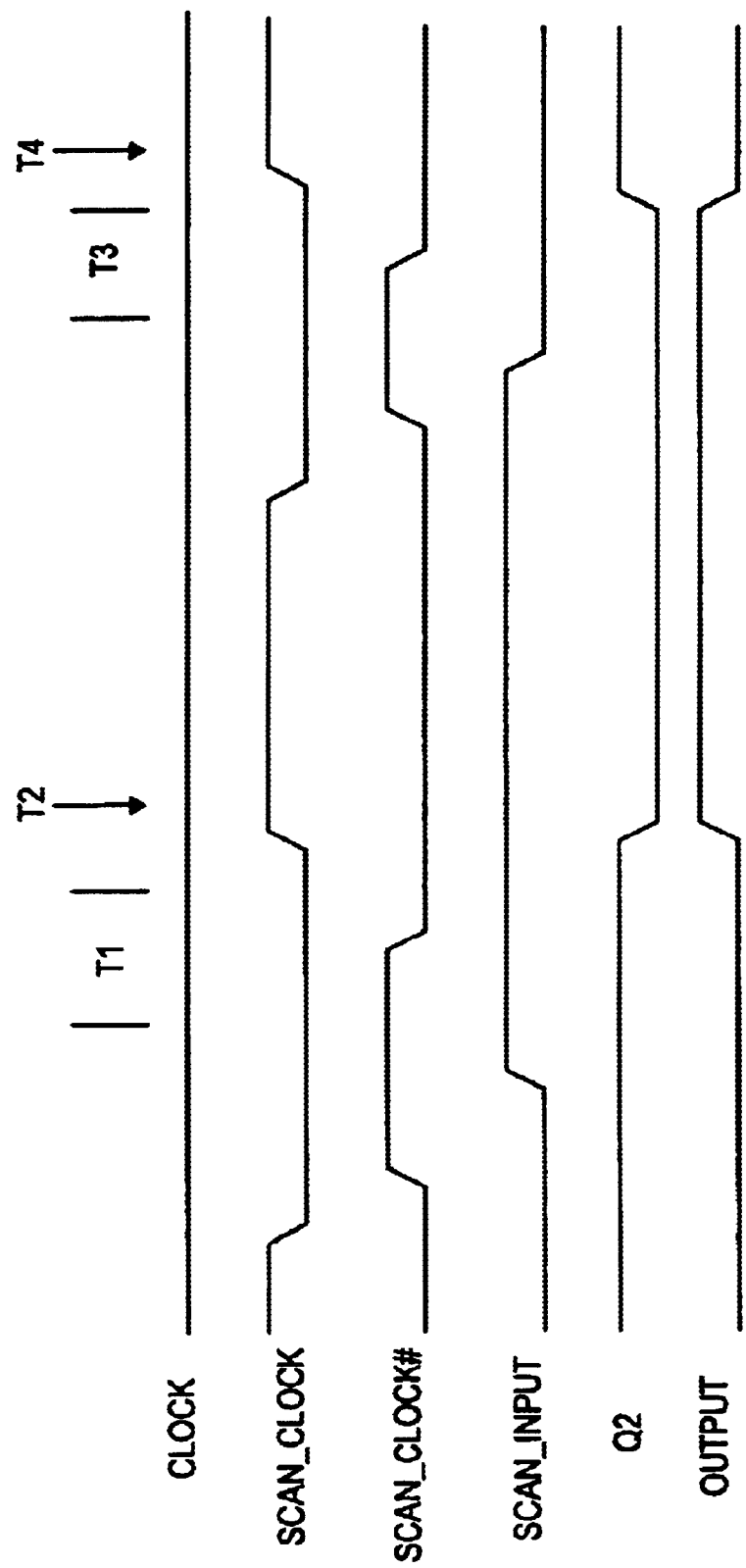
FIG. 3 is a timing representation of the operation of the flip-flop in accordance with a particular embodiment of the present invention.

Turning to FIG. 3, an example of how flip-flop 50 may operate while integrated circuit 10 is in a test mode is provided. As shown, at time, T1, SCAN_CLOCK# is a logic high value. Consequently, the value of SCAN_INPUT may be stored in storage unit 65. Once SCAN_CLOCK# transitions to a low logic value, the data in storage unit 65 remains the same even if the value of SCAN_INPUT changes. On the subsequent rising transition of SCAN_CLOCK, (i.e. time T2) the data in storage unit 65 is provide to slave circuit 80 (i.e., at node labeled QZ in FIG. 2). Slave circuit 89 stores the value provided by master circuit 80 and provides the new logic as OUTPUT to other portion of integrated circuit 10.

Note, the logical value of OUTPUT does not change until after a subsequent transition in SCAN_CLOCK (i.e. time T4). It should be noted that in this example the clock signal, CLOCK, which may be coupled to the other portions of flip-flop 50, remained at a low logic level. This should be considered optional and may be desirable to reduce the risk that changes in the input signal DATA affect the operation of flip-flop 50 while integrated circuit is in a test mode or it otherwise not in a normal operation mode.

Figure 4:
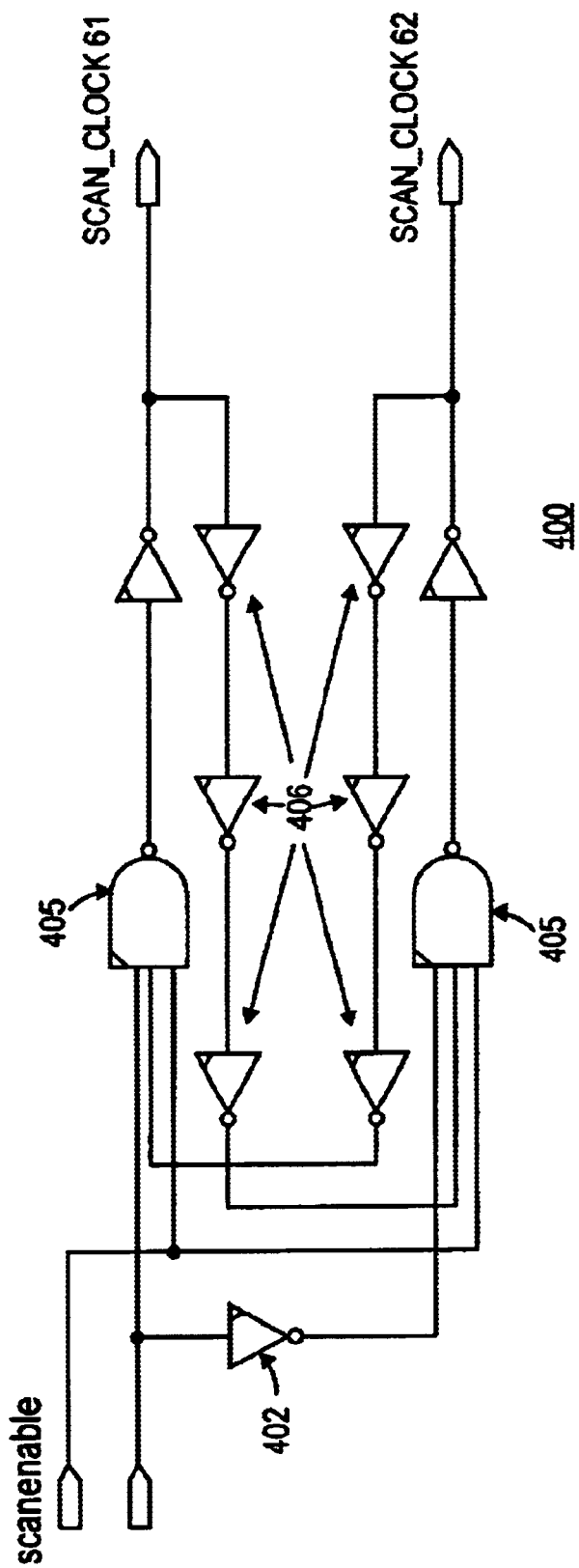
FIG. 4 is a schematic of a clock generation circuit in accordance with an embodiment of the present invention.

Turning to FIG. 4, a clock circuit 400 that may be used to generate clock signals in accordance with an embodiment of the present invention is described. However, it should be understood that the scope of the present invention is not limited so as to require the use of this particular circuit. In alternative embodiments, other circuits may be used. As shown, a CLOCK_INPUT 401 may be used to provide the transitions for SCAN_CLOCK 61 and SCAN_CLOCK# 62. An inverter 402 may be used so that that SCAN_CLOCK 61 and SCAN_CLOCK# 62 are typically the logical complements of each other. In addition, one or more inverters 406 may be used to determine the amount of delay between a transition in one clock signal and a subsequent transition in the other clock signal. The non-overlap time may be proportional to the number of inverters 406. Thus, in this particular embodiment, the clock signals SCAN_CLOCK 61 and SCAN_CLOCK# 62 have non-overlapping transitions (i.e., only one of the clock signals changes at a time).

Clock circuit 400 may also optionally comprise NAND gates 405 and use an enable signal (i.e. SCANENABLE) that may be used to control when the clock signals SCAN_CLOCK 61 and SCAN_CLOCK# 62 are generated. For example, although the scope of the present invention is not limited in this respect, clock circuit 400 may only be enabled by SCANENABLE and may only generate clock signal when integrated circuit 10 is in a test mode.

Returning to FIG. 2, the operation of flip-flop 50 while integrated circuit 10 is not in a test mode is described. When the operation of integrated circuit 10 is not being verified (i.e., integrated circuit 10 is in normal operation and is executing instructions), flip-flop 50 may operate as a pulsed latch. In normal operation, a clock signal (e.g., CLOCK 90) may be used to control when the input logic value, DATA 91, is stored in slave circuit 80. In this mode of operation, flip-flop 50 may be referred to as a pulsed latch because a clock signal having a relatively short duty cycle may be used to control when an input signal (e.g. DATA 91) is stored in slave circuit 80 of flip-flop 50. For example, CLOCK 90 may have a duty cycle of less than thirty percent. This may be desirable to reduce the power consumption of flip-flop 50 and integrated circuit 10.

In this embodiment, the logic value of DATA 91 is only provided to and stored in slave circuit 80 when CLOCK 90 is a high logic level. This is due, at least in part, to the presence of an inverter 95. In alternative embodiments, inverter 95 may be removed or positioned elsewhere so that the input data is stored in slave 80 when CLOCK 90 is a low logic level. Note, while integrated circuit 10 is in normal operation mode, it may be desirable to disable the generation of the scan clock signals SCAN_CLOCK 61 and SCAN_CLOCK 62 so that changes in the input signal SCAN_INPUT do not interfere with the operation of flip-flop 50.

Accordingly, when integrated circuit 10 is in a test mode, scan clock signals SCAN_CLOCK 61 and SCAN_CLOCK# 62 may be used to provide and control when test data is presented to slave circuit 80. When integrated circuit 10 is in normal operation, clock signal CLOCK 90 may be used to control and determine when input data is provided to slave circuit 80.

Figure 5:
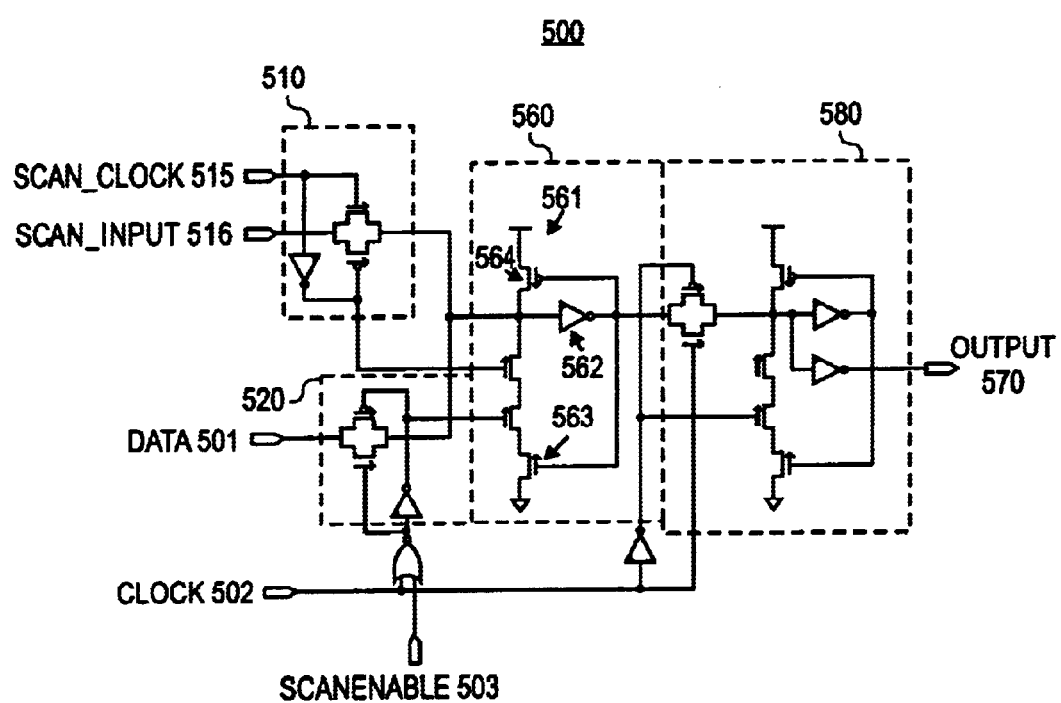
FIG. 5 is a schematic representation of a flip-flop is accordance with an alternative embodiment of the present invention.

Turning now to FIG. 5, a flip-flop 500 in accordance with an alternative embodiment of the present invention is described. Flip-flop 500 may comprise a master circuit 560 that may provide an input logic value that is stored in a slave circuit 580. In this particular embodiment, master circuit 560 has an input node or port that may be connected to one or more sources of input signals. In this example, master circuit 560 may be connected to a test input circuit 510 and an operational input circuit 520.

When integrated circuit 10 (see FIG. 1) is in normal mode of operation (i.e. executing instructions), operational input circuit 520 may provide input to master circuit 560. For example, a clock signal (i.e. CLOCK 502) may be used to provide an input data signal (i.e. DATA 501) to the input of master circuit 560. When not in test mode, the scan enable signal (SCANENABLE 503) may be at a low logic level so that DATA 501 may be provided to master circuit 560 when CLOCK 502 is at low logic value. Master circuit 560 may store this logic value in a storage circuit 561 so that the data may be stored in slave circuit 580 when CLOCK 502 subsequently transitions to a high logic value. In this particular embodiment, storage circuit 561 of master circuit 560 may comprise an inverter 562 and transistors 563–564. However, the scope of the present invention is not limited in this respect as storage circuit 561 may be implemented using other techniques in alternative embodiments.

When integrated circuit 10 enters a test mode, the SCANENABLE signal may transition to a high logic value. This, in turn, may disable the operation of operational input circuit 520. In this mode, a scan clock signal (i.e., SCAN_CLOCK 515) may be used to control and provide a test input value (i.e., SCAN_INPUT 516) to master circuit 560. For example, when SCAN_CLOCK 515 is a high logic value, the test input data (i.e., SCAN_INPUT 516) is provided to the input node or port of master circuit 560. Master circuit 560 may then store the test input value so that the data may be provided to slave circuit 580 when CLOCK 502 subsequently transitions to a high logic level. Thus, SCAN_CLOCK 515 may be used to control when data is stored in master circuit 560. CLOCK 502 may be used to determine when the test data is stored in slave circuit 580 and provided as an output, OUTPUT 570 to portions of integrated circuit 10.

SCAN_CLOCK 515 and CLOCK 502 may be generated such that they do not have any overlapping transitions. This may be desirable to reduce the risk that there are race-through conditions. For example, as long as CLOCK 502 transitions to a high logic level after SCAN_CLOCK 515 has transitioned to a low logic level, then the data stored in master circuit 560 will be provided as the output of flip-flop 560 despite any changes to SCAN_INPUT 516 or DATA 501. Thus, when integrated circuit 10 is in normal operation, CLOCK 501 may be used to provide DATA 501 to master circuit 560, and when integrated circuit 10 is in a test mode, SCAN_CLOCK 515 may be used to provide SCAN_INPUT 516 to master circuit 560.

Figure 6:
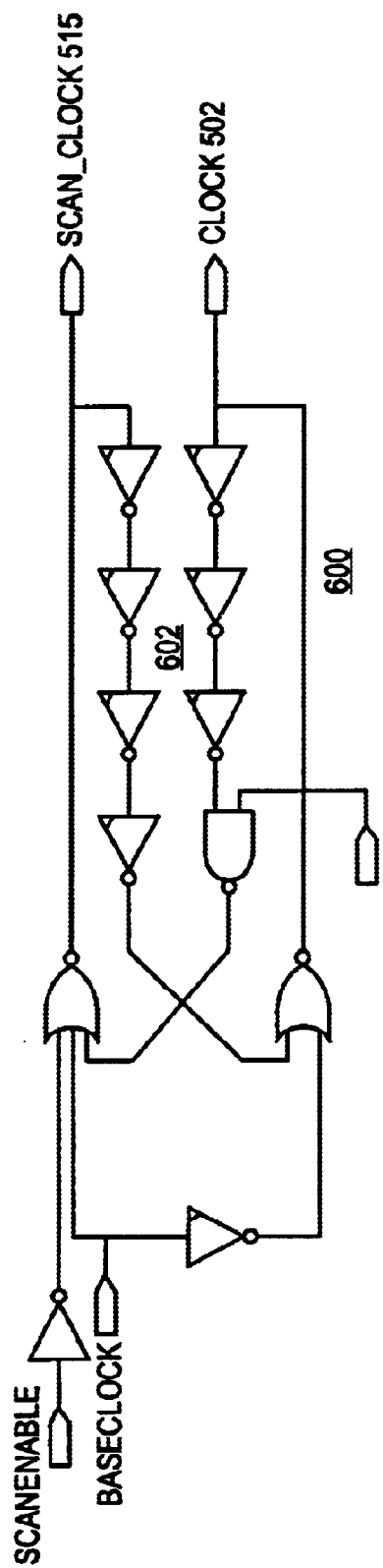
FIG. 6 is a schematic representation of a clock generation circuit in accordance with an alternative embodiment of the present invention.

Turning now to FIG. 6, a clock generation circuit 600 that may be used to provide the clock signal to flip-flop 500 shown in FIG. 5 is described. A SCANENABLE signal may be used to enable the operation of clock generation circuit 600 so that SCAN_CLOCK 515 is only generated when integrated circuit 10 is in a test mode. As shown a BASECLOCK signal is used to provide the transitions for the generation of SCAN_CLOCK 515 and inverters 602 are used to determine the amount of time or delay between a transition in SCAN_CLOCK 515 and a subsequent transition in CLOCK 502 or vice-versa. Note, clock generation circuit 600 may optionally use a STOPCLOCK signal to indicate that the generation of all clock signals should cease. This may be desirable to reduce the power consumption associated with clock generation when integrated circuit is in a low power mode of operation.

Accordingly, particular embodiments of the present invention may be used to test the operability of an integrated circuit. At least some of these embodiments use two clock signals that have non-overlapping transitions to reduce the risk of race-through conditions. While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An integrated circuit comprising:
a master-slave flip-flop that receives data and scan data, wherein the scan data is received by a master portion and clocked by a first clock signal into a slave portion, and wherein the slave portion includes,
an inverter;
a first transistor having a gate connected to an output of the inverter, a source connected to a first power conductor and a drain connected to an input of the inverter, and
a pair of stacked transistors coupled between the input of the inverter and a second power conductor where a gate of a first transistor of the pair of stacked transistors receives a second clock signal and a gate of a second transistor of the pair of stacked transistors receives an output signal from the inverter.

2. The integrated circuit of claim 1, wherein the master-slave flip-flop is adapted to receive the first clock signal whose transitions do not overlap with transitions in the second clock signal.

3. The integrated circuit of claim 1, further comprising a clock generation circuit, wherein the clock generation circuit is adapted to generate the first clock signal and the second clock signal, transitions in the first clock signal non-overlapping with transitions in the second clock signal.

4. The integrated circuit of claim 2, wherein the master-slave flip-flop is adapted to receive a third clock signal, the first clock signal and the second clock signal being provided to the master-slave flip-flop when the integrated circuit is in a first operational mode, and the third clock being provided to the master-slave flip-flop when the integrated circuit is in a second operational mode.

5. An apparatus comprising:
a master-slave flip-flop having first and second inputs, the first input providing scan data to a master portion at a first clock signal when the apparatus is in a first operational mode, and a second clock signal to provide data at the second input to a slave portion when the apparatus is in a second operational mode, wherein the slave portion includes an inverter and a feedback inverter, where the feedback inverter includes
a first transistor having a gate connected to an output of the inverter, a source connected to a first power conductor and a drain connected to an input of the inverter; and
second and third transistors to couple the input of the inverter to a second power conductor, a gate of the second transistor is coupled to the second clock signal and a gate of the third transistor is connected to an output of the inverter.

6. The apparatus of claim 5, wherein the first operational mode is a test mode.

7. The apparatus of claim 5, comprising a logic circuit adapted to receive an enable signal, the enable signal provided when the apparatus is in the test mode.

8. The apparatus of claim 5, further comprising a clock generation circuit adapted to provide the first dock signal and the second clock signal, the first clock signal having transitions that do not overlap with transitions in the second clock signal.

9. A method comprising:
clocking data from a buffer into a slave portion of a flip-flop;
generating a first clock signal and a second clock signal that have transitions that do not overlap with each other;
storing a scan value in a static latch in a master portion of the flip-flop upon a transition in the first clock cycle;
replacing the data stored in the slave portion with the scan value upon a subsequent transition in the second clock signal, wherein the slave portion includes an inverter; and
feeding back a signal from an output of the inverter to an input using a first transistor having a gate connected to an output of the inverter, a source connected to a first power conductor and a drain connected to an input of the inverter, and a pair of stacked transistors coupled between the input of the inverter and a second power conductor.

10. The method of claim 9, wherein generating the first clock signal and the second clock signal includes enabling the first and second clock signals in a test mode.

* * * * *